United States Patent
Jung

[11] Patent Number: 6,163,497
[45] Date of Patent: Dec. 19, 2000

[54] SEMICONDUCTOR MEMORY DEVICE

[75] Inventor: In Chul Jung, Ichon, Rep. of Korea

[73] Assignee: Hyndai Electronics Industries Co., Ltd., Rep. of Korea

[21] Appl. No.: 09/321,760

[22] Filed: May 28, 1999

[30] Foreign Application Priority Data

May 29, 1998 [KR] Rep. of Korea .................. 98-19784

[51] Int. Cl.⁷ .................................................. G11C 8/00
[52] U.S. Cl. .................... 365/230.06; 365/200; 326/105
[58] Field of Search .......................... 365/230.06, 200, 365/189.01, 230.01; 326/105

[56] References Cited

U.S. PATENT DOCUMENTS

| | | | |
|---|---|---|---|
| 5,504,713 | 4/1996 | Ooishi et al. | 365/200 |
| 5,530,674 | 6/1996 | McClure et al. | 365/201 |
| 5,579,268 | 11/1996 | Seo et al. | 365/200 |
| 5,761,139 | 6/1998 | Shibata et al. | 365/200 |
| 5,787,046 | 7/1998 | Furuyama et al. | 365/230.03 |
| 5,808,948 | 9/1998 | Kim et al. | 365/201 |
| 5,841,712 | 11/1998 | Wendell et al. | 365/200 |
| 5,867,439 | 2/1999 | Asakura et al. | 365/222 |
| 5,901,083 | 5/1999 | Atsumi et al. | 365/185.11 |
| 5,970,001 | 10/1999 | Noda et al. | 365/200 |
| 5,987,577 | 11/1999 | Miller et al. | 711/168 |

*Primary Examiner*—David Nelms
*Assistant Examiner*—Hoai V. Ho
*Attorney, Agent, or Firm*—Nath & Associates; Gary M. Nath; Harold L. Novick

[57] ABSTRACT

A predecoder of a semiconductor memory device which is capable of selectively inverting a signal output from a decoding unit adapted to decode internal addresses generated from address buffers, thereby achieving an improvement in the utility thereof. The predecoder includes a selection unit for selectively outputting one of the signals having different logic levels while being generated based on an output signal from the decoding unit. Where the predecoder is applied to a cell repair circuit using antifuses, it is possible to reduce the layout area of the cell repair circuit, thereby achieving a reduction in the chip size. This results in a reduction in the costs of the chip.

6 Claims, 12 Drawing Sheets

SEMICONDUCTOR MEMORY DEVICE

BACKGROUND OF THE INVENTION

1. Field of the Invention

The present invention relates to a predecoder of a semiconductor memory device, and more particularly to a circuit for predecoding internal addresses in a semiconductor memory device, and the circuit has a function for controlling a signal output from an output stage thereof, thereby being capable of achieving an improvement in the utility thereof.

2. Description of the Related Art

Where there are a number of input addresses to be decoded, it is inefficient to simultaneously decode those input addresses. In order to improve the decoding efficiency, a predecoder is used. The predecoder is a circuit for previously decoding a portion of the input addresses to be decoded, for example, two or three input addresses.

An output from such a predecoder is applied to a main decoder so that it is completely decoded in the main decoder.

Where decoding is carried out in a sequential manner as mentioned above, it is possible to minimize the number of transistors to be used for the decoding, thereby reducing the design area.

Outputs from a predecoder, which are grouped for an address group, are independent from those grouped for other address groups. For instance, a group of predecodings, for example, four predecodings, generated after predecoding an address group including, for example, the 0-th and first addresses, are independent from those generated after predecoding another address group including, for example, the second and third addresses. From each independent predecoding group, only one predecoding is selected based on an input address.

In the case of conventional predecoders, predecodings have a logic "high" or "low" level for one selected input address while having an opposite logic level for the remaining input addresses.

For instance, where a predecoder is used which is adapted to predecode the second and third input addresses, predecodings output from the predecoder may be designated by "ax23<0>", "ax23<1>", "ax23<2>", and "ax23<3>", respectively.

If the predecoding "ax23<0>" corresponds to a selected output address, it is then output at a logic "high" level. In this case, the remaining predecodings "ax23<1>", "ax23<2>", and "ax23<3>" are output at a logic "low" level. Otherwise, the predecoding "ax23<0>" is output at a logic "low" level whereas the remaining predecodings "ax23<1>", "ax23<2>", and "ax23<3>" are output at a logic "high" level. In such a fashion, only one predecoding is selected for a selected output address.

However, such a predecoder is used for limited applications. In other words, it cannot be used in the case in which it is necessary to use an output signal having a logic level opposite to that of the output signal from the predecoder under a particular condition.

Generally, predecoders are frequently used in combination with a logic circuit.

For instance, a "redundancy use identifying circuit" is coupled to a predecoder in order to use an output from the predecoder.

Where there are defects or failures occurring in several cells in a semiconductor memory cell including a plurality of cell arrays due to a variety of reasons, it is necessary to replace those cells with repair cells in order to prevent a degradation in the throughput of the chip. To this end, the user inputs addresses designating those cells involving defects. In this case, the "redundancy use identifying circuit" is a circuit for identifying, in response to the addresses input by the user, whether or not the cells involving defects have been replaced with repair cells.

Such a redundancy use identifying circuit is physically recorded with address data associated with repair cells. The address data is always present in the redundancy use identifying circuit without being volatilized after a power cut-off.

For physical recording of address data, there are many methods including a recording method using fuses, a recording method using antifuses, and other various non-volatile recording methods.

Referring to FIG. 1b, a cell repair circuit using fuses is illustrated. In this cell repair circuit, a fuse corresponding to the address of a cell to be replaced with a repair cell is cut off.

When an address designating a cell to be replaced with a repair cell is input to the cell repair circuit, for instance, when input addresses "ax23<0>", "ax45<1>", and "ax67<2>" have a logic "high" level whereas the remaining input addresses have a logic "low" level, no current path is established between a node A and the ground, as shown in FIG. 1b. In this state, accordingly, the node A is maintained at a precharge potential level, namely, a high potential level. As a result, a signal nrd indicative of an address designating the repair cell is generated. Based on the signal nrd, a repair operation is then conducted.

In this case, the signal nrd has a logic "high" level.

On the other hand, when an address designating a normal cell requiring no replacement thereof, for instance, when input addresses "ax23<1>", "ax45<1>", and "ax67<2>" have a logic "high" level, at least one current path is established between the node A and the ground. In this state, the precharge voltage having a "high" potential level is coupled to the ground via the current path. As a result, the signal nrd indicative of an address designating the repair cell is not generated. In this case, a normal operation is conducted.

That is, the signal nrd has a "low" potential level.

In FIG. 1b, input addresses "ax23<0:3>", "ax45<0:3>", and "ax67<0:3>" are predecodings, namely, predecoded signals, output from a predecoder shown in FIG. 1a.

In the case of the cell repair circuit using fuses, as shown in FIG. 1b, the signal nrd indicative of an address designating the repair cell is generated only when all fuses cut off are selected. That is, the signal nrd is generated in accordance with an ANDing operation for programmed (namely, cut-off) fuses.

Referring to FIG. 2, a cell repair circuit using antifuses is illustrated.

An antifuse is a device having a function opposite to that of a fuse. That is, such an antifuse has characteristics of an electrical connection when being programmed. The antifuse has a basic configuration similar to a capacitor. When such an antifuse is programmed, an insulating layer included in the antifuse collapses, thereby causing the antifuse to be rendered in an electrical connection state.

Where antifuses are used in the fabrication of semiconductor devices, it is possible to reduce the area for fuses. Those semiconductor devices can be also repaired even in a packaged state. The reduction of the fuse size expected by virtue of the use of antifuses can be achieved proportionally to the size reduction for other semiconductor device parts.

The operation of the cell repair circuit using antifuses will now be described in conjunction with FIG. 2.

In an initial precharge state, a node A in the cell repair circuit of FIG. 2 has a "high" potential level.

In this state, the cell repair circuit conducts a normal operation or a repair operation in accordance with an input address generated from a predecoder coupled thereto. For the normal operation, the node A should be maintained in a "high" potential state. On the other hand, the node A should be maintained in a "low" potential state for the repair operation.

For the repair operation, it is necessary to establish a current path for flowing current from the node A to the ground because the initial state of the node A corresponds to a "high" potential level.

That is, in the case of an independent input address group "ax23<0:3>", the input address "ax23<0>" should have a "high" potential level. In the case of an independent input address group "ax45<0:3>", the input address "ax45<1>" should have a "high" potential level. In the case of an independent input address group "ax67<0:3>", the input address "ax67<2>" should have a "high" potential level.

In the configuration of FIG. 2, however, the repair operation is enabled by not only an input address selecting all the three programmed antifuses, but also by an input address selecting one of those programmed antifuses.

This is contrary to the system in which a repair operation is carried out only when all antifuses programmed for all independent input address groups are selected. As a result, a repair operation for cells requiring no repair may be carried out, thereby resulting in a malfunction of the system.

In order to solve problems involved in the circuit of FIG. 2, a cell repair circuit modified from that of FIG. 2 has been proposed. Examples associated with such a cell repair circuit are illustrated in FIGS. 3 and 4, respectively.

In the cell repair circuit shown in FIG. 3, power separation is made for each circuit part including one programmed antifuse. Signals generated from respective circuit parts as a result of the power separation are input to an AND gate which, in turn, generates an output signal nrd. In this cell repair circuit, a redundancy operation is conducted when all input stages of the AND gate have a "high" level.

In other words, respective nodes A, B, and C of all circuit parts should have a "low" potential level for the redundancy operation. This state is obtained only when the input addresses "ax23<0>", "ax45<1>", and "ax67<2>" selecting respective programmed antifuses of all circuit parts have a "low" level.

In the case of FIG. 3, accordingly, there is no possibility of a malfunction of the system which may occur in the case of FIG. 2.

However, the cell repair circuit of FIG. 3 is problematic in that the entire area of the chip increases.

Typically, current semiconductor memory devices require cell repair circuits, each including five circuit parts due to an increased storage capacity thereof.

In such a case, five nodes are coupled into an AND gate. Such a circuit should be provided at each of the redundancy circuits which are typically several hundreds in number. For this reason, it is difficult to reduce the entire memory area.

In the case of the cell repair circuit shown in FIG. 4, a method is used in which antifuses to be selected are not intended to be programmed while the remaining antifuses are programmed.

For a redundancy operation of this circuit, a node A should be maintained in a "high" potential state.

This state is obtained only when all input addresses selecting respective antifuses not programmed have a "high" level.

In the circuit of FIG. 4, accordingly, there is no possibility of a malfunction of the system which may occur in the case of FIG. 2.

However, the cell repair circuit of FIG. 4 involves a problem in regard to reliability because a large number of antifuses should be programmed. For this reason, this circuit cannot provide the best solution. Furthermore, this circuit involves a degradation in the repair efficiency.

SUMMARY OF THE INVENTION

Therefore, an object of the present invention is to solve the above-mentioned problems involved in the related art and to provide a predecoder which includes a circuit coupled to an output stage of the predecoder and adapted to selectively invert an output from the predecoder, thereby being capable of achieving an improvement in the utility thereof.

Another object of the invention is to provide a redundancy circuit having a reduced layout area, thereby being capable of achieving a reduction in the chip size.

Another object of the invention is to provide a method for controlling a redundancy circuit which allows the redundancy circuit to easily cope with an environmental variation occurring in the redundancy circuit.

In accordance with one aspect, the present invention provides a predecoder comprising decoding means for decoding internal addresses' generated address input buffers, further comprising: a selection means for selectively outputting one of the signals which have different logic levels as the input address, the signals being generated based on an output signal from the decoding means.

In accordance with another aspect, the present invention provides a redundancy circuit for replacing a cell involving defects with a repair cell in a semiconductor memory device, including a plurality of antifuses selectively programmed to enable the repair cell when an input address selecting the programmed antifuses are generated, and means for generating the input address, the means comprising decoding means for decoding internal addresses' generated address input buffers included in the semiconductor memory device, wherein the antifuse programming means further comprises: selection means for selectively outputting one of the signals which have different logic levels as the input address, the signals being generated based on an output signal from the decoding means.

In accordance with another aspect, the present invention provides a method for controlling a redundancy circuit adapted to replace a cell involving defects with a repair cell in a semiconductor memory device with the redundancy circuit including a plurality of antifuses selectively programmed to enable the repair cell when an input address respectively selecting the programmed antifuses is generated, and means for generating the input address wherein the means comprises decoding means for decoding internal addresses' generated address input buffers included in the semiconductor memory device, wherein the decoding means is controlled to selectively generate an output signal to be used as the input address.

BRIEF DESCRIPTION OF THE DRAWINGS

Other objects and aspects of the invention will become apparent from the following description of embodiments with reference to the accompanying drawings in which:

FIG. 7a is a circuit diagram illustrating a combination of predecoders having a configuration of FIG. 6a;

FIG. 8a is a circuit diagram illustrating a combination of predecoders having a configuration of FIG. 6a.

DESCRIPTION OF THE PREFERRED EMBODIMENTS

Figure 5:
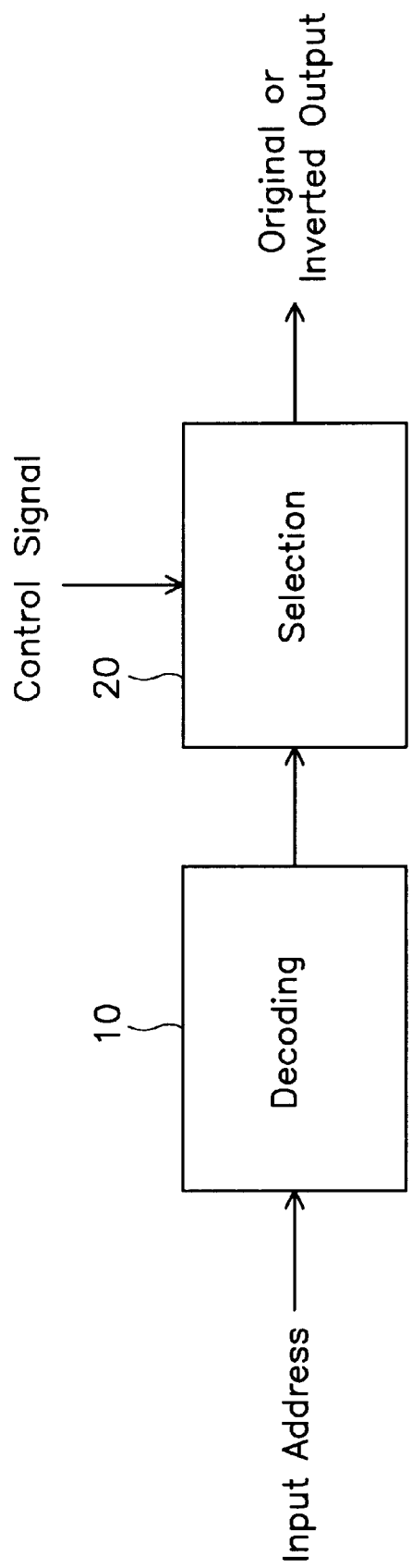
FIG. 5 is a block diagram illustrating a predecoder according to an embodiment of the present invention in which a selection unit is coupled to the output stage of a decoding unit in order to selectively output inverted addresses.

FIG. 5 is a block diagram illustrating a predecoder according to an embodiment of the present invention. As shown in FIG. 5, the predecoder includes a decoding unit 10 for receiving input addresses and logically composing the received input addresses, thereby outputting a decoded signal, and a selection unit 20 for receiving the decoded signal from the decoding unit 10 and selectively outputting the decoded signal in an original state thereof or an inverted state thereof in accordance with the potential level of a control signal applied to the selection unit 20.

The decoding unit 10 conducts an operation for decoding input addresses in accordance with a logical operation. The selection unit 20 conducts an operation for outputting the decoded signal from the decoding unit 10 in an original state thereof or an inverted state thereof in accordance with the potential level of the control signal.

Figure 6A:
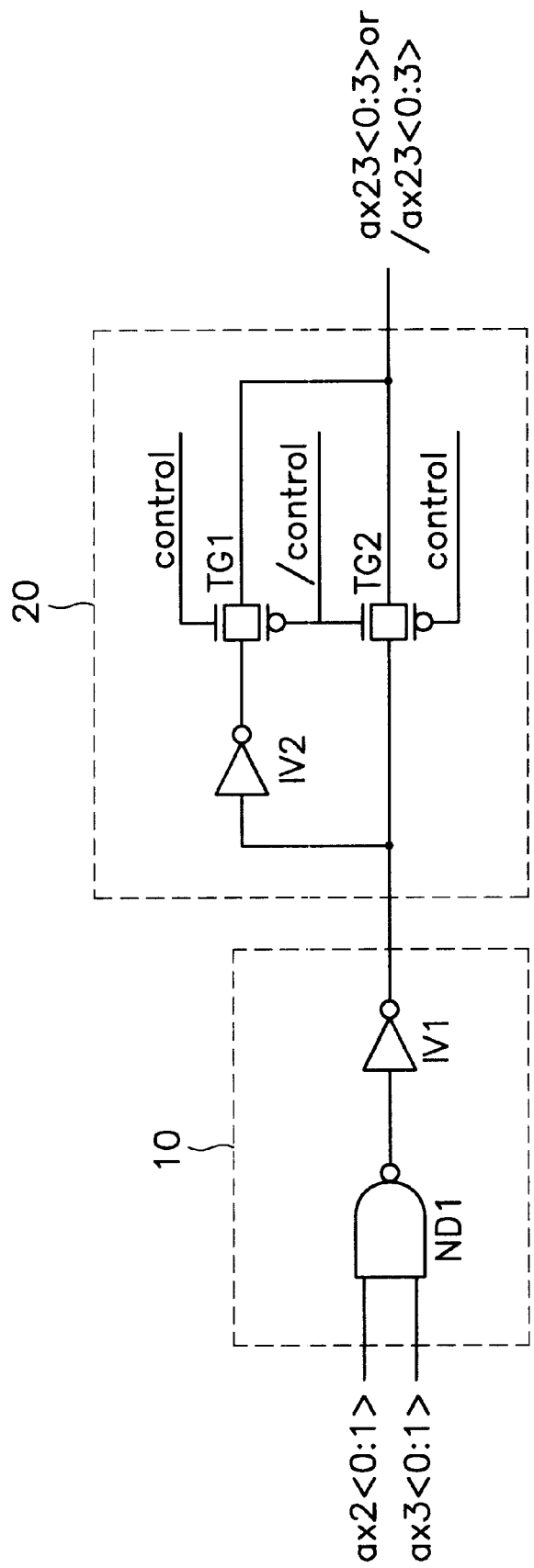
FIG. 6a is a circuit diagram illustrating an embodiment of the predecoder shown in FIG. 5 in accordance with the present invention, in which transmission gates are used to control an output from the decoding unit.

FIG. 6a is a circuit diagram illustrating an embodiment of the predecoder shown in FIG. 5. As shown in FIG. 6a, the predecoder includes a decoding unit 10 for receiving row addresses "ax2<0:1>" and "ax3<0:1>" and conducting a decoding operation for those received row addresses, thereby outputting four decoded signals. The predecoder also includes a selection unit 20 coupled to an output stage of the decoding unit 10. The selection unit 20 serves to output each decoded signal generated from the decoding unit 10 in an original state thereof or an inverted state thereof in accordance with the potential level of a control signal applied to the selection unit 20.

The decoding unit 10 includes a first NAND gate ND1 and a first inverter IV1.

The selection unit 20 includes a second inverter IV2 adapted to invert each decoded signal output from the decoding unit 10, a first transmission gate TG1 configured to turn on in response to the control signal applied thereto and adapted to transmit an output from the second inverter IV2 in its turn-on state, and a second transmission gate TG2 configured to turn on in response to the control signal applied thereto and adapted to transmit each decoded signal output from the decoding unit 10 in its turn-on state.

The decoding unit 10, which receives row addresses "ax2<0:1>" and "ax3<0:1>", outputs a "high"-level signal when both the received row addresses have a "high" level.

The selection unit 20 generates an output signal having a potential level depending on the potential level of the control signal applied thereto. When the control signal has a "high" level, the second transmission gate TG2 on a first path is closed whereas the first transmission gate TG1 on a second path is opened. As a result, the output from the decoding unit 10 is transmitted after being inverted by the second inverter IV2.

In other words, when the control signal has a "low" level, one decoded signal having a "high" level and three decoded signals having "low" levels are output. On the other hand, where the control signal has a "high" level, three decoded signals having "high" levels and one decoded signal having a "low" level are output.

As is apparent from the above description, the predecoder of FIG. 6a configured as mentioned above in accordance with the present invention can selectively control the potential level of a decoded signal output therefrom. Where the predecoder is applied to a system using predecoders, it is possible to achieve an improvement in the ability of the system to cope with an environmental variation occurring in the system without modifying the circuit configuration of the system.

Figure 6B:
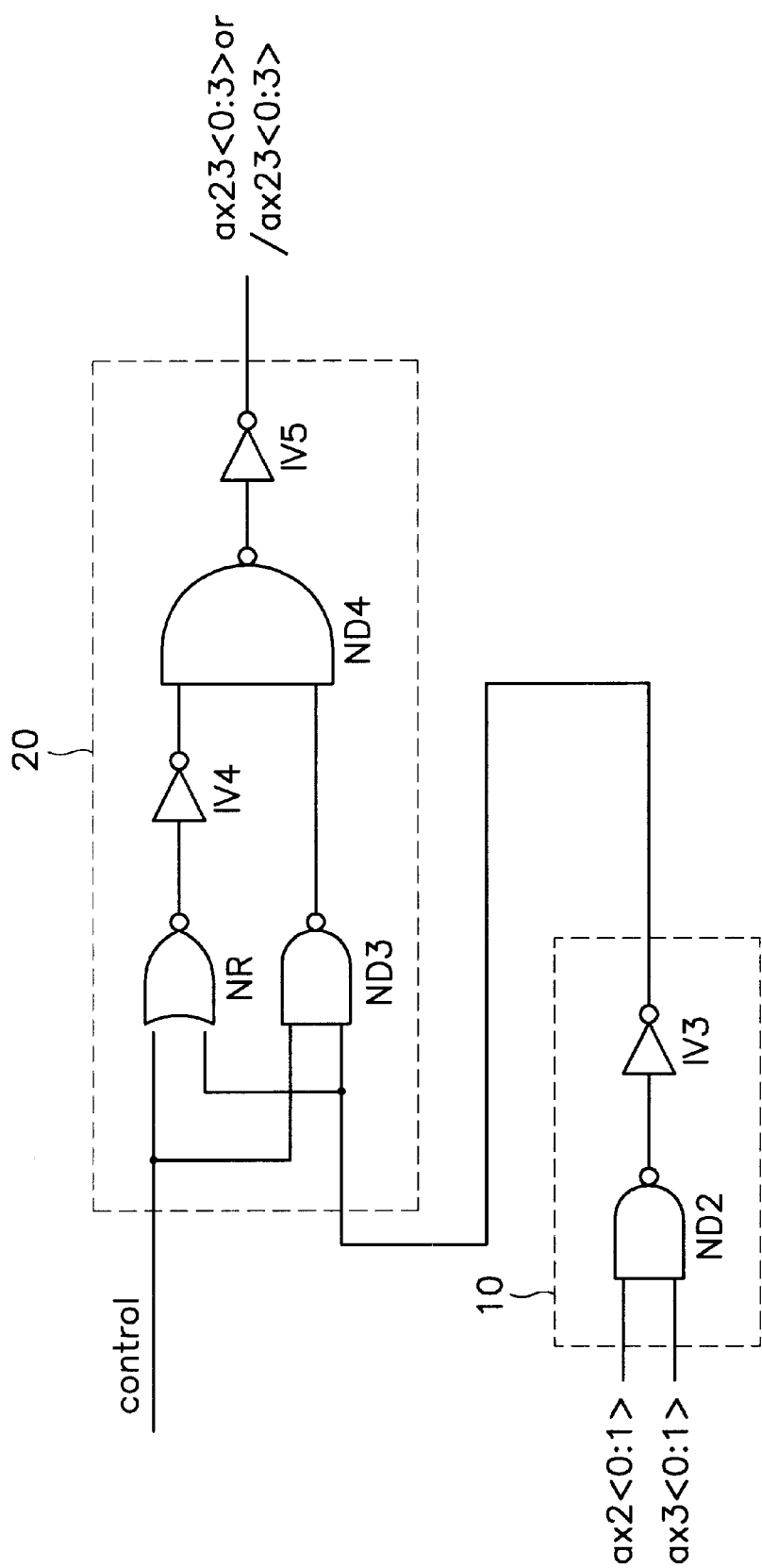
FIG. 6b is a circuit diagram illustrating another embodiment of the predecoder shown in FIG. 5 in accordance with the present invention, in which a logic circuit is used to control an output from the decoding unit.

FIG. 6b is a circuit diagram illustrating another embodiment of the predecoder shown in FIG. 5. In accordance with this embodiment, the selection unit 20 of the predecoder is configured using a logic circuit.

The decoding unit 10 of this predecoder includes a first NAND gate ND2 and a first inverter IV3.

The selection unit 20 includes a NOR gate NR adapted to receive an output signal from the decoding unit 10 along with a control signal and to conduct a logical operation for those received signals, a second NAND gate ND3 adapted to receive the output signal from the decoding unit 10 along with the control signal and to conduct a logical operation for those received signals, a second inverter IV4 adapted to invert an output from the NOR gate NR, a third NAND gate ND4 adapted to receive an output from the second NAND gate ND3 along with an output from the second inverter IV4, and a third inverter IV5 adapted to invert the output from the third NAND gate ND4 and to output the resultant signal as a decoded signal.

Now, the operation of the predecoder shown in FIG. 6b will be described. When the control signal has a "low" potential level, the selection unit 20 selects, as its output signal, the output signal from the decoding unit 10 which is not in an inverted state. On the other hand, where the control signal has a "high" potential level, the selection unit 20 selects the output signal from the decoding unit 10 which is in an inverted state as its output signal.

Although the predecoder of FIG. 6b has a different circuit configuration from that of FIG. 6a, its operation is carried out in the same manner as that in FIG. 6a.

As is apparent from the above description, the predecoder of FIG. 6b configured as mentioned above in accordance with the present invention can selectively control the potential level of a decoded signal output from the decoding unit by the selection unit coupled to the output stage of the decoding unit. Where the predecoder is applied to a system using predecoders, it is possible to achieve an improvement in the ability of the system to cope with an environmental variation occurring in the system without modifying the circuit configuration of the system.

Examples of circuits, to which the present invention is applied, will now be described in conjunction with FIGS. 7b and 8b, respectively.

Figure 7A:
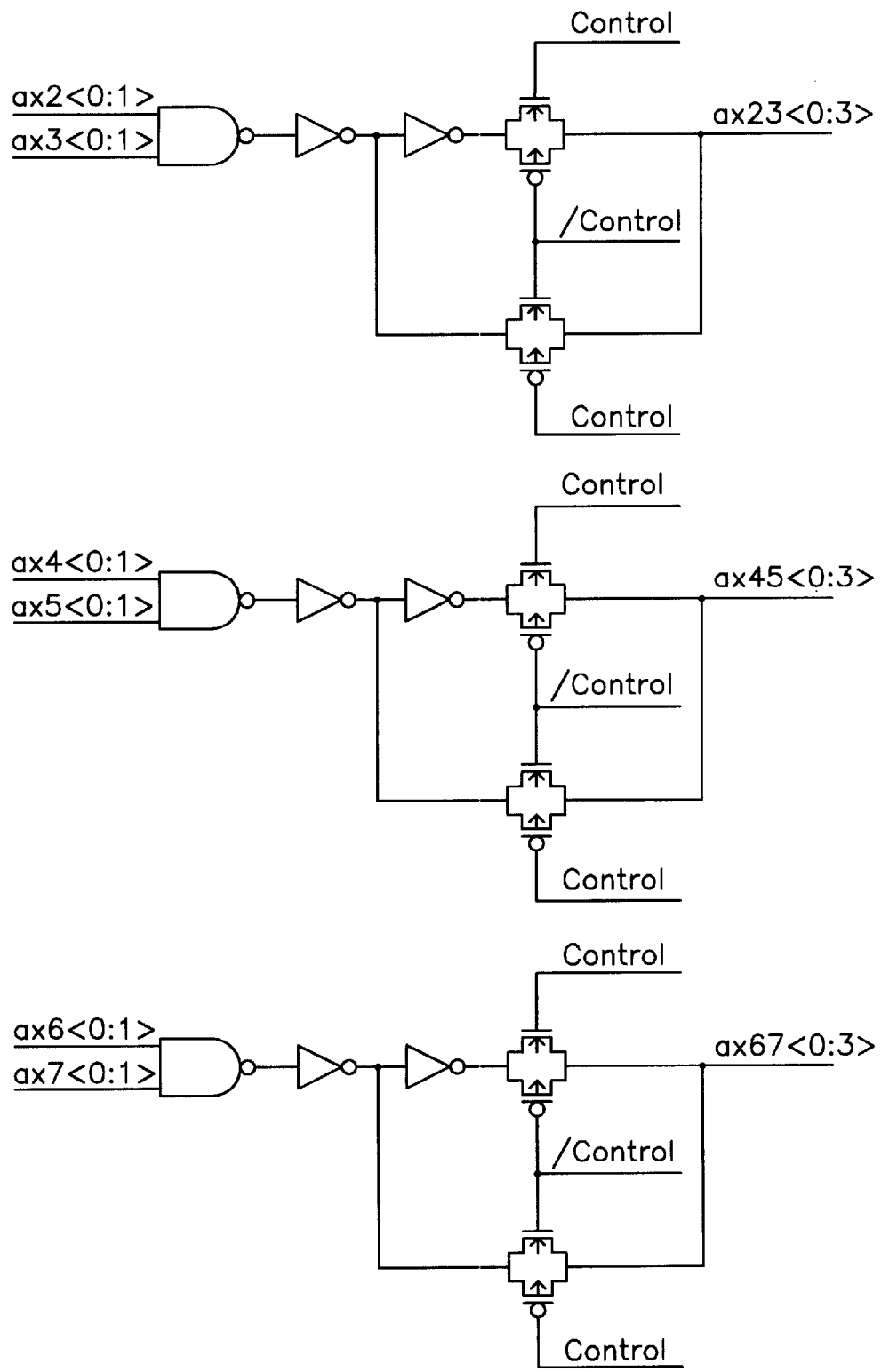
Figure 7B:
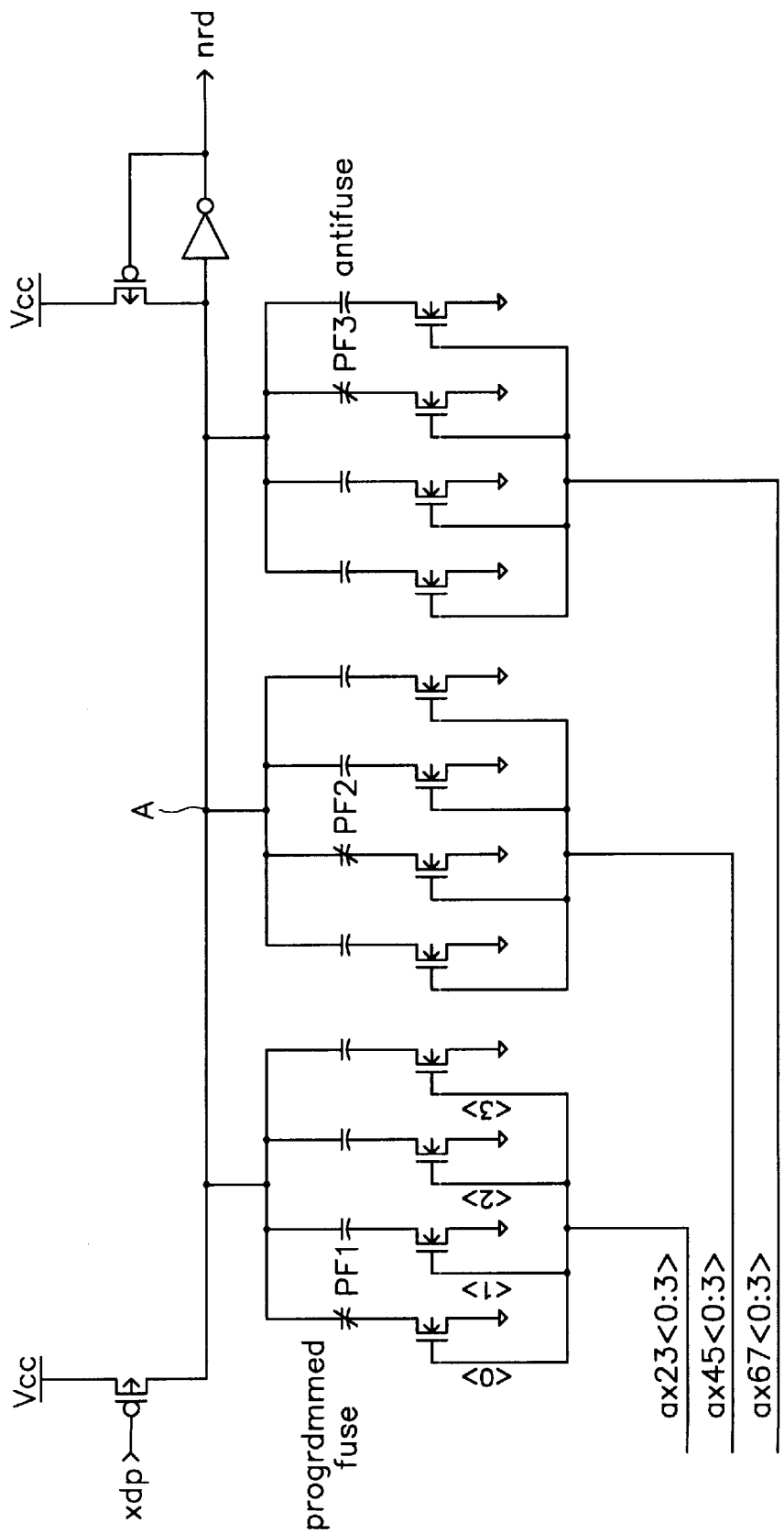
FIG. 7b is a circuit diagram illustrating a redundancy circuit using the circuit of FIG. 7a in accordance with the present invention wherein the redundancy circuit is adapted to replace a cell involving defects with a repair cell, based on antifuses programmed when a control signal used in the circuit of FIG. 7a has a "high" level.

FIG. 7b illustrates a cell repair circuit adapted to replace a cell involving defects with a repair cell.

In this circuit, the node A should be maintained at a "high" potential level for a repair operation.

In an initial state of the circuit, the node A is in a state precharged by a power supply voltage Vcc having a "high" potential level. In this initial state, there is no decoded signal input.

When decoded signals "ax23<0:3>", "ax45<0:3>", and "ax67<0:3>" are subsequently input, the cell repair circuit conducts a normal operation or a repair operation in accordance with the voltage levels of the decoded signals. In the case of FIG. 7b, the repair operation is conducted when all the decoded signals, which are adapted to select programmed antifuses, respectively, have a "low" level.

That is, the repair operation can be conducted when all the decoded signals "ax23<0>", "ax45<1>", and "ax67<2>" have "low" levels.

The decoded signals, which are input to the cell repair circuit, are generated from predecoders shown in FIG. 7a. Referring to FIG. 7a, each predecoder includes a decoding unit comprising a combination of AND gates.

Accordingly, each decoding unit outputs one decoded signal having a "high" level and three decoded signals having "low" levels.

In the case of the cell repair circuit shown in FIG. 7b, decoded signals for selecting respective programmed antifuses should have a "low" level for the repair operation.

In order to meet such a system condition of the cell repair circuit shown in FIG. 7b, the control signal used in the case of FIG. 7a should be controlled to have a "high" level.

To this end, each predecoder including one decoding unit outputs one decoded signal having a "low" level and three decoded signals having "high" levels. These decoded signals are then applied to the cell repair circuit.

Based on the decoded signals applied to the cell repair circuit, no current path is established between node A and the ground in the cell repair circuit. Accordingly, the node A is maintained at a "high" potential level. Thus, a repair operation is conducted.

Where at least one of the decoded signals respectively selecting three programmed antifuses has a "high" level, a current path is established between the node A and the ground, thereby causing the potential level of the node A to be switched to a "low" level. In this state, no repair operation occurs.

As is apparent from the above description, the cell repair circuit of FIG. 7b conducts a repair operation when all decoded signals for selecting respective programmed antifuses should have a "low" level, as compared to the case of FIG. 7b in which all decoded signals for selecting respective programmed antifuses should have a "high" level. Accordingly, the repair operation can be conducted, even when the system environment varies, by selecting a desired predecoder output in accordance with a control signal. Therefore, the utility of the predecoder increases correspondingly.

Figure 1A:
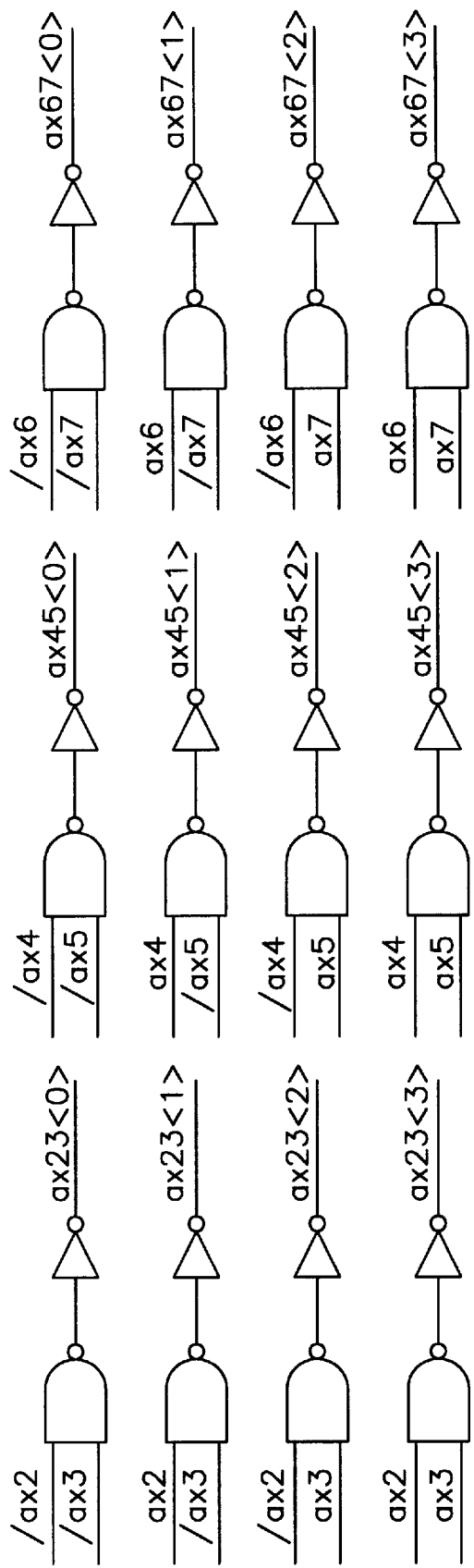
FIG. 1a is a circuit diagram illustrating a general predecoder.
Figure 1B:
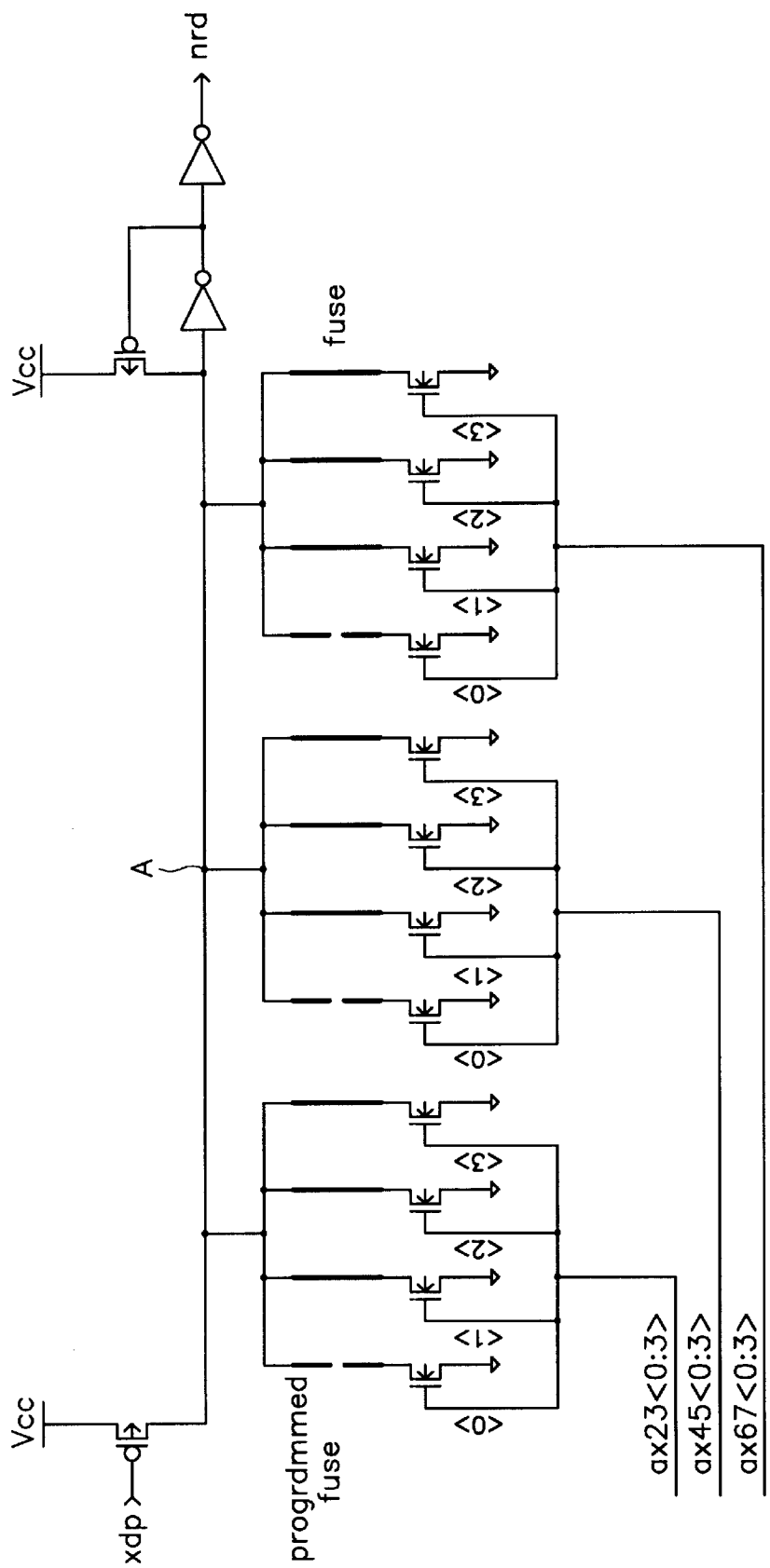
FIG. 1b is a circuit diagram illustrating a general redundancy circuit in which a repair operation is conducted when all programmed fuses are selected.
Figure 2:
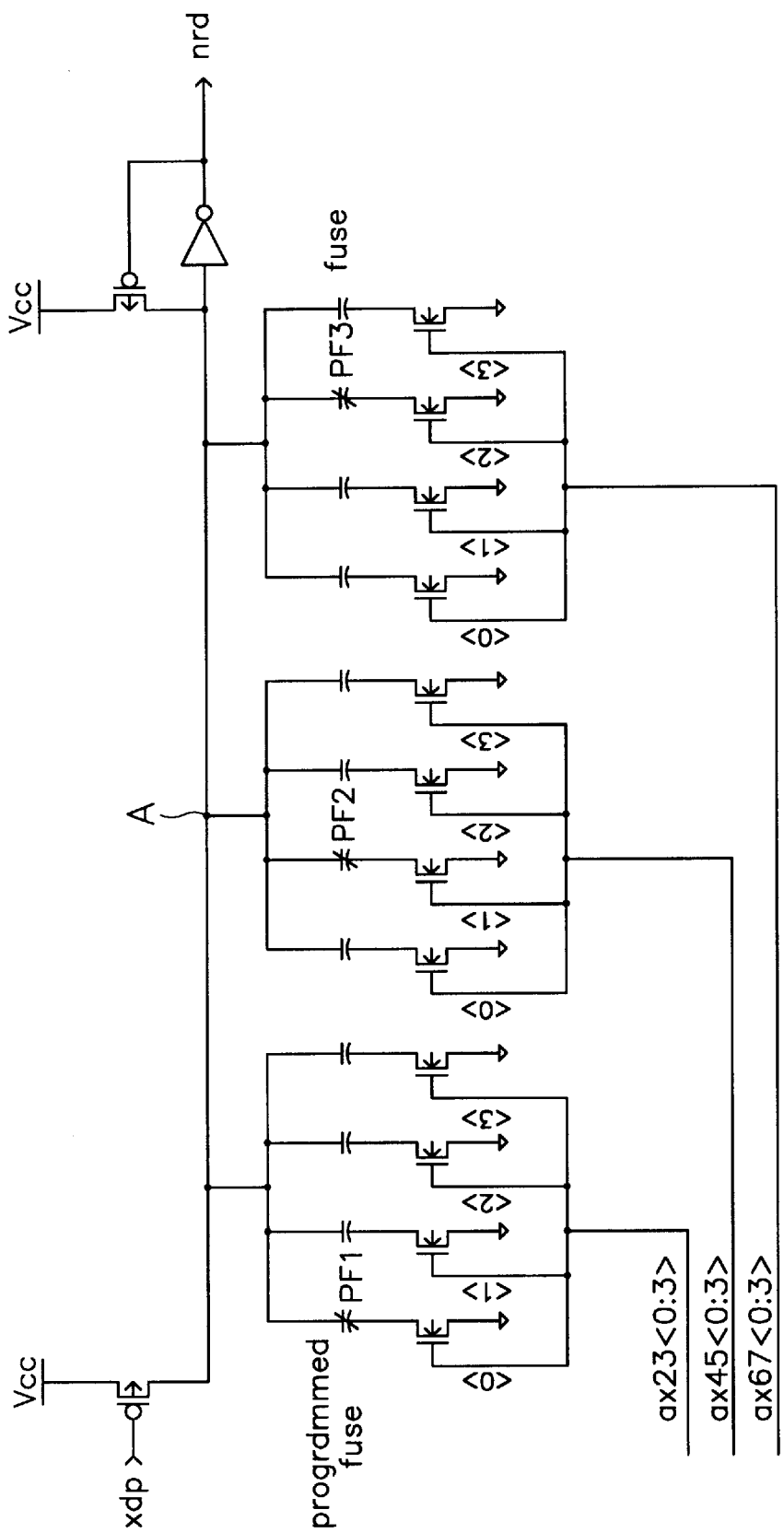
FIG. 2 is a circuit diagram illustrating a conventional redundancy circuit in which a repair operation is conducted not only when all programmed antifuses are selected, but also when at least one of the programmed antifuses is selected.
Figure 3:
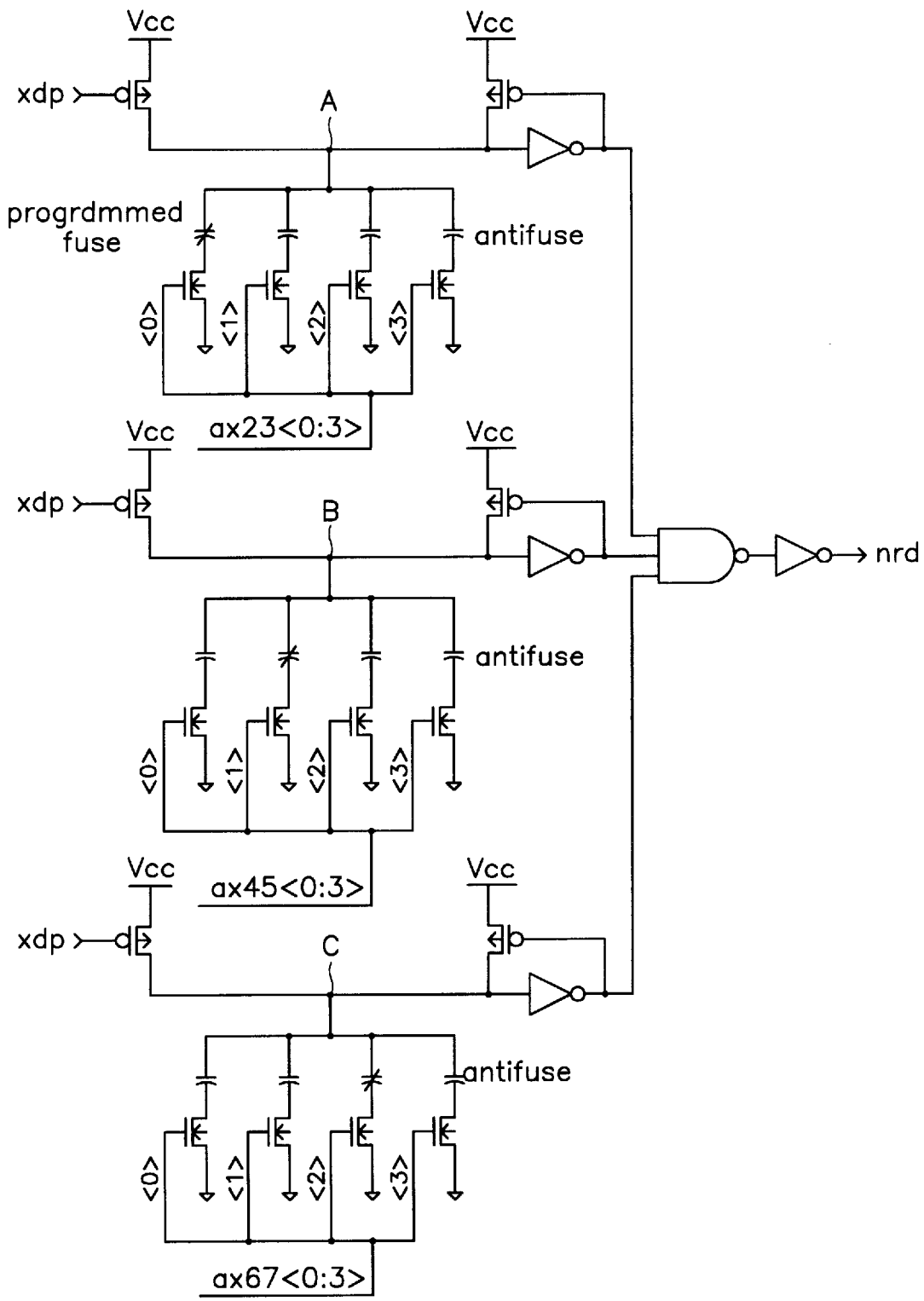
FIG. 3 is a circuit diagram illustrating another conventional redundancy circuit improved over the circuit of FIG. 2.
Figure 4:
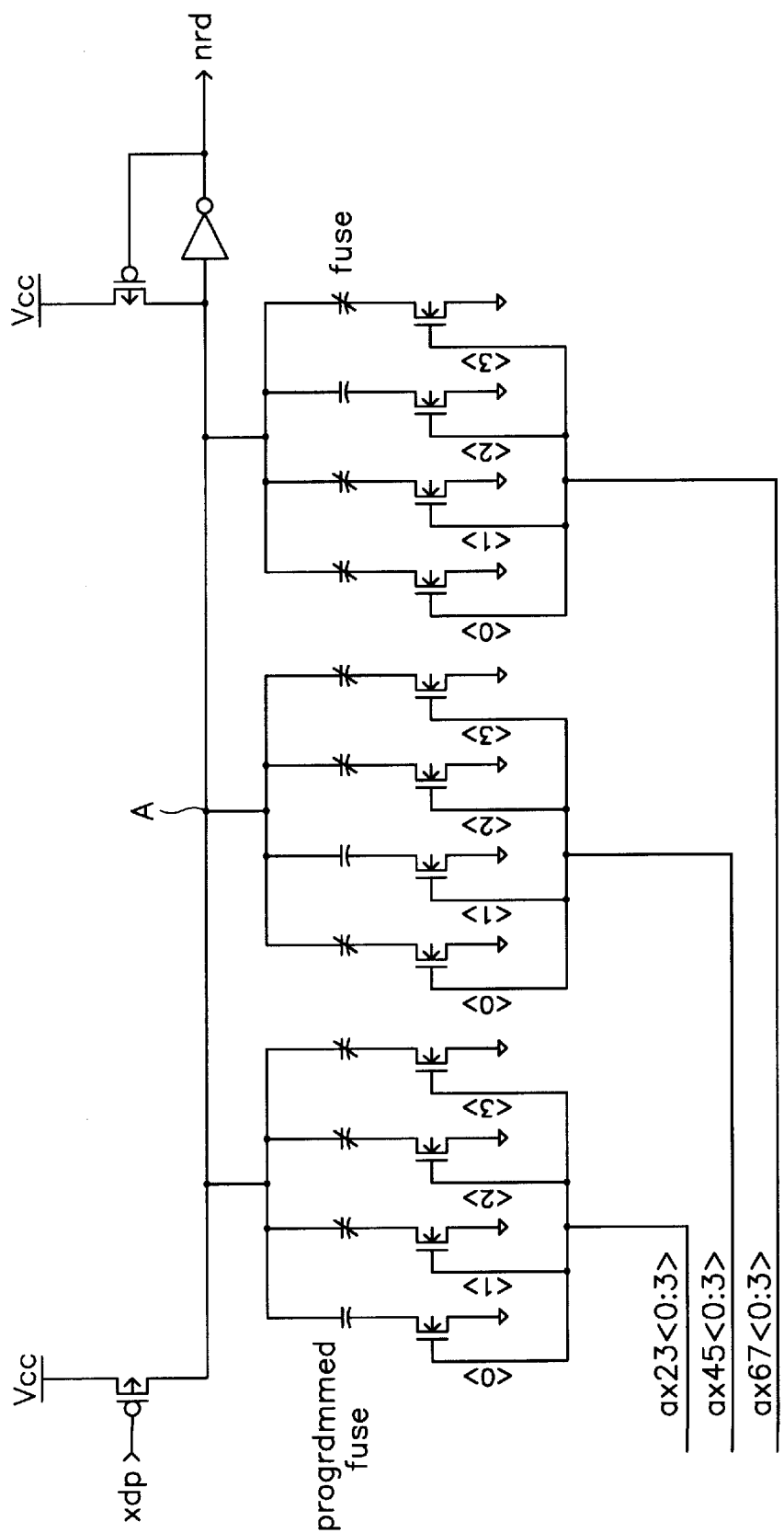
FIG. 4 is a circuit diagram illustrating another conventional redundancy circuit improved over the circuit of FIG. 2.
Figure 8A:
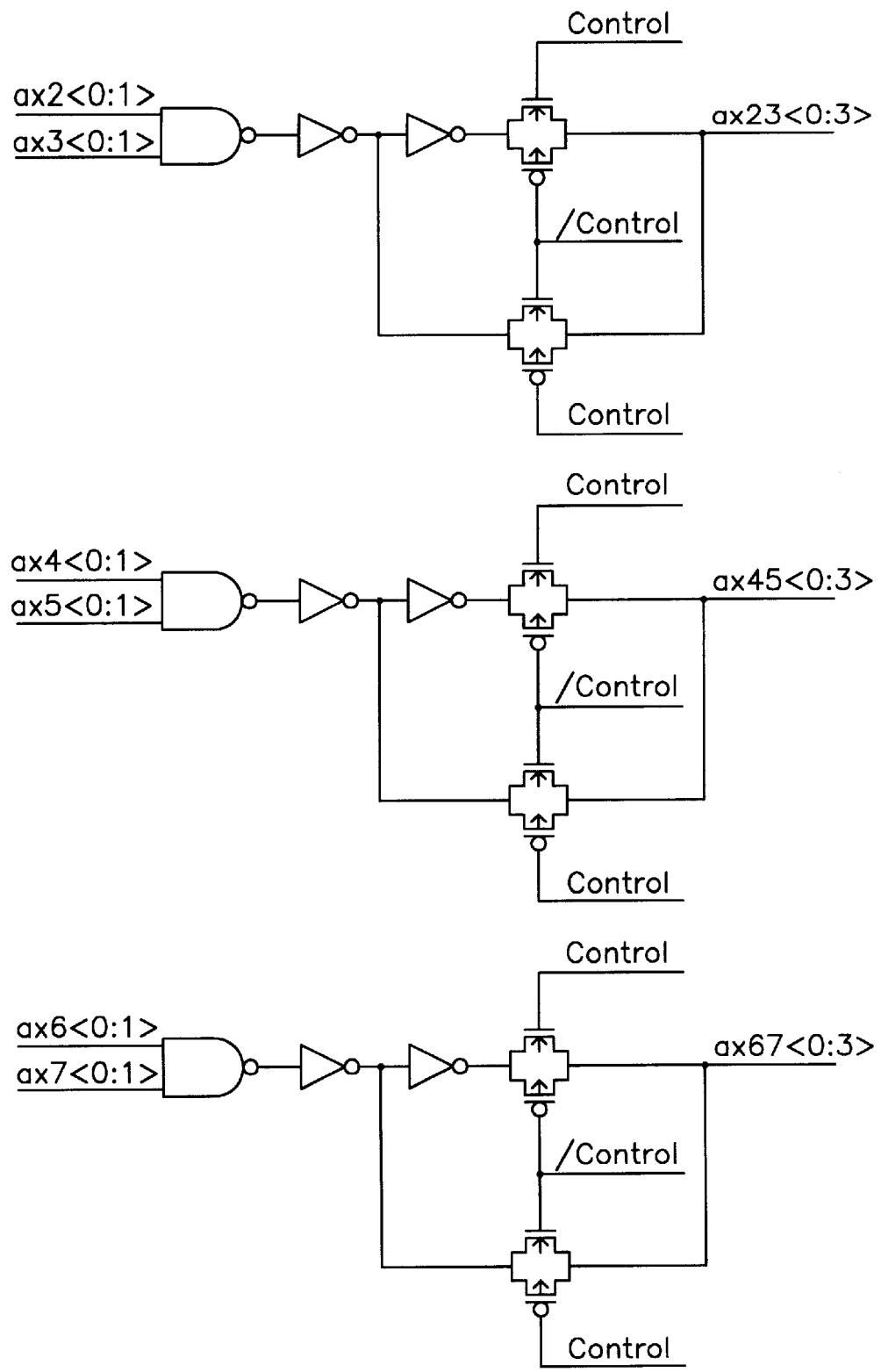
Figure 8B:
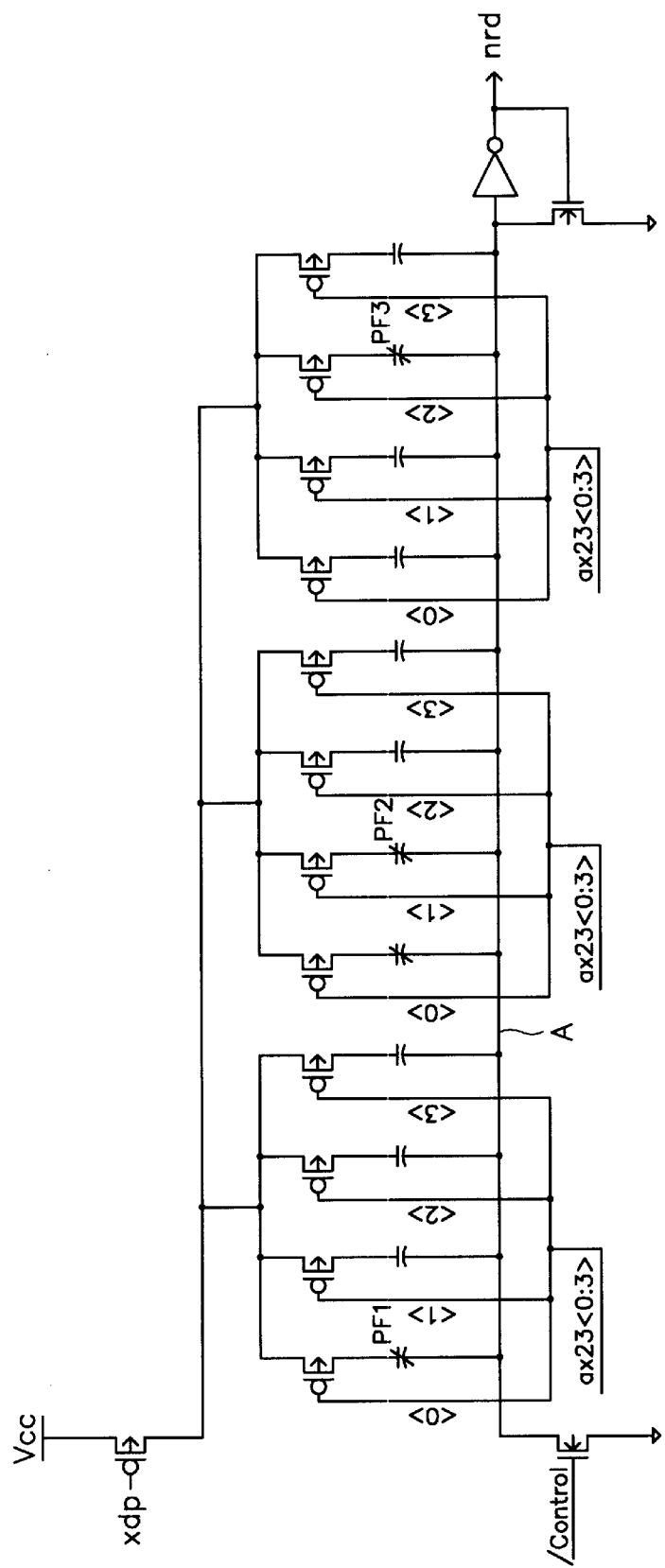
FIG. 8b is a circuit diagram illustrating a redundancy circuit using the circuit of FIG. 7a in accordance with the present invention wherein the redundancy circuit is adapted to replace a cell involving defects with a repair cell, based on antifuses programmed when a control signal used in the circuit of FIG. 8a has a "low" level.

FIG. 8b illustrates a cell repair circuit in which a repair operation is conducted when node A is in a "low" potential state, as compared to the case of FIG. 2.

In order to enable the repair operation in this circuit, decoded signals respectively selecting three programmed antifuses should have "high" levels whereas the remaining decoded signals should have "low" levels.

That is, each of the predecoders which is coupled to the cell repair circuit of FIG. 8b and shown in FIG. 8a, should output one decoded signal having a "high" level and three decoded signals having "low" levels.

To this end, the control signal used in the case of FIG. 8a should be controlled to have a "low" level.

In accordance with the control signal having a "low" level, respective outputs from the decoding units are output without being inverted and then applied to the cell repair circuit. Accordingly, the cell repair circuit conducts a repair operation.

As is apparent from the above description, the predecoder of the present invention is capable of selectively outputting an original decoded signal or an inverted decoded signal in accordance with the state of the control signal applied thereto. Accordingly, the predecoder of the present invention can be more easily applied to systems such as cell repair circuits using antifuses.

Although the present invention has been described in conjunction with an application to a predecoder, it may also be equivalently applied to a main decoder. Where the present invention is applied to a main decoder, the same function and effect as mentioned above are obtained.

Where the present invention is applied to a cell repair circuit using antifuses, it is possible to reduce the layout area of the cell repair circuit, thereby achieving a reduction in the chip size. This results in a reduction in the costs of the chip. Accordingly, products having an enhanced competitiveness can be made.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device including a predecoder, the predecoder comprising:

decoding means for decoding input addresses; and selection means for selectively outputting an output signal or an inverted output signal from said decoding means in accordance with a control signal;

wherein said selection means comprises:

a first logic gate for receiving said output signal from said decoding means along with said control signal;

a second logic gate for receiving said output signal from said decoding means along with said control signal; and a third logic gate for receiving an inverted signal of an output signal from said first logic gate along with an output from said second logic gate.

2. The semiconductor memory device as claimed in claim 1, wherein said first logic gate comprises a NOR gate.

3. The semiconductor memory device as claimed in claim 1, wherein each of said second and third logic gates comprises a NAND gate.

4. A semiconductor memory device including a redundancy circuit, the semiconductor comprising:

a redundancy circuit for replacing a cell involving defects with a repair cell;

decoding means for decoding input addresses; and selection means for selectively outputting an output signal or an inverted output signal from said decoding means in accordance with a control signal;

wherein the redundancy circuit comprises a plurality of antifuses selectively programmed in accordance with signals selectively outputted from said selection means;

wherein said selection means comprises:

a first logic gate for receiving said output signal from said decoding means along with said control signal;

a second logic gate for receiving said output signal from said decoding means along with said control signal; and a third logic gate for receiving an inverted signal of an output signal from said first logic gate along with an output from said second logic gate.

5. The semiconductor memory device as claimed in claim 4, wherein said first logic gate comprises a NOR gate.

6. The semiconductor memory device as claimed in claim 4, wherein each of said second and third logic gates comprises a NAND gate.

* * * * *